US010102789B2

(12) United States Patent
Evans, V et al.

(10) Patent No.: US 10,102,789 B2
(45) Date of Patent: Oct. 16, 2018

(54) MOBILE DEVICE WITH DISPLAY OVERLAID WITH AT LEAST A LIGHT SENSOR

(71) Applicant: Essential Products, Inc., Palo Alto, CA (US)

(72) Inventors: David John Evans, V, Palo Alto, CA (US); Xinrui Jiang, San Jose, CA (US); Andrew E. Rubin, Los Altos, CA (US); Matthew Hershenson, Los Altos, CA (US); Xiaoyu Miao, Palo Alto, CA (US); Joseph Anthony Tate, San Jose, CA (US); Jason Sean Gagne-Keats, Cupertino, CA (US); Rebecca Schultz Zavin, Portolla Valley, CA (US)

(73) Assignee: ESSENTIAL PRODUCTS, INC., Palo Alto, CA (US)

( * ) Notice: Subject to any disclaimer, the term of this patent is extended or adjusted under 35 U.S.C. 154(b) by 0 days.

(21) Appl. No.: 15/283,204

(22) Filed: Sep. 30, 2016

(65) Prior Publication Data
US 2017/0124933 A1    May 4, 2017

Related U.S. Application Data

(60) Provisional application No. 62/249,130, filed on Oct. 30, 2015, provisional application No. 62/300,631, (Continued)

(51) Int. Cl.
*G06F 3/041* (2006.01)
*G09G 3/20* (2006.01)
(Continued)

(52) U.S. Cl.
CPC ......... *G09G 3/2003* (2013.01); *G06F 3/005* (2013.01); *G06F 3/044* (2013.01); *G06F 3/045* (2013.01);
(Continued)

(58) Field of Classification Search
None
See application file for complete search history.

(56) References Cited

U.S. PATENT DOCUMENTS 4,928,301 A    5/1990   Smoot et al.
5,466,926 A   11/1995   Sasano et al.
(Continued)

FOREIGN PATENT DOCUMENTS

CN   101048727 A   10/2007
CN   102379002 A    3/2012
(Continued)

OTHER PUBLICATIONS

Advisory Action dated May 30, 2017, for U.S. Appl. No. 15/231,664 of Evans, D.J. et al. filed Aug. 8, 2016.
(Continued)

*Primary Examiner* — Joseph Haley
(74) *Attorney, Agent, or Firm* — Perkins Coie LLP

(57) ABSTRACT

Some embodiments include a mobile device with a light sensor overlaid under a display (e.g., a touchscreen). The mobile device can identify a command to capture an image. The mobile device can adjust at least a target portion of an opaqueness adjustable region of the display directly over the light sensor. The opaqueness adjustable region is capable of transforming from substantially opaque to substantially transparent. The mobile device can capture the image utilizing at least the light sensor while the target portion of the opaqueness adjustable region is substantially transparent.

18 Claims, 8 Drawing Sheets

Related U.S. Application Data filed on Feb. 26, 2016, provisional application No. 62/319,099, filed on Apr. 6, 2016, provisional application No. 62/373,910, filed on Aug. 11, 2016.

(51) Int. Cl.
| | |
|---|---|
| *G06F 3/00* | (2006.01) |
| *G09G 3/3225* | (2016.01) |
| *G09G 3/36* | (2006.01) |
| *G06F 3/044* | (2006.01) |
| *G06F 3/045* | (2006.01) |
| *H01L 27/32* | (2006.01) |
| *G06F 3/0488* | (2013.01) |
| *H04N 7/15* | (2006.01) |
| *H04N 7/14* | (2006.01) |

(52) U.S. Cl.
CPC ......... *G06F 3/0412* (2013.01); *G09G 3/3225* (2013.01); *G09G 3/36* (2013.01); *H01L 27/323* (2013.01); *H01L 27/3234* (2013.01); *H01L 27/3244* (2013.01); *G06F 3/04883* (2013.01); *G06F 2203/04101* (2013.01); *G09G 2354/00* (2013.01); *G09G 2360/144* (2013.01); *H01L 2227/323* (2013.01); *H01L 2251/308* (2013.01); *H04N 7/144* (2013.01); *H04N 7/15* (2013.01)

(56) References Cited

U.S. PATENT DOCUMENTS

| | | | |
|---|---|---|---|
| 5,828,406 A | 10/1998 | Parulski et al. | |
| 6,107,618 A | 8/2000 | Fossum et al. | |
| 6,627,907 B1 | 9/2003 | Cole et al. | |
| 6,867,821 B2 | 3/2005 | De Schipper | |
| 6,876,143 B2 | 4/2005 | Daniels | |
| 6,885,157 B1 | 4/2005 | Cok et al. | |
| 6,992,718 B1 | 1/2006 | Takahara | |
| 7,034,866 B1* | 4/2006 | Colmenarez ............ H04N 3/155 348/14.07 |
| 7,106,392 B2 | 9/2006 | You | |
| 7,130,011 B2 | 10/2006 | Hsieh et al. | |
| 7,697,053 B2 | 4/2010 | Kurtz et al. | |
| 8,103,085 B1 | 1/2012 | Zadeh | |
| 8,576,325 B2 | 11/2013 | Dudek et al. | |
| 8,867,015 B2 | 10/2014 | Posner et al. | |
| 9,057,931 B1 | 6/2015 | Baldwin | |
| 9,204,089 B2 | 12/2015 | Nagano et al. | |
| 9,843,736 B2 | 12/2017 | Evans et al. | |
| 2002/0089467 A1 | 7/2002 | Hara | |
| 2004/0212555 A1 | 10/2004 | Falco | |
| 2004/0257473 A1 | 12/2004 | Miyagawa | |
| 2006/0136846 A1 | 6/2006 | Im et al. | |
| 2006/0146008 A1 | 7/2006 | Johnson et al. | |
| 2007/0002130 A1 | 1/2007 | Hartkop | |
| 2007/0081094 A1 | 4/2007 | Ciudad et al. | |
| 2007/0109239 A1 | 5/2007 | Den Boer et al. | |
| 2007/0247439 A1 | 10/2007 | Daniel et al. | |
| 2008/0068484 A1 | 3/2008 | Nam | |
| 2008/0106628 A1 | 5/2008 | Cok et al. | |
| 2008/0142599 A1 | 6/2008 | Benillouche et al. | |
| 2008/0165267 A1 | 7/2008 | Cok | |
| 2008/0292144 A1 | 11/2008 | Kim | |
| 2009/0102763 A1 | 4/2009 | Border et al. | |
| 2009/0121619 A1 | 5/2009 | Rajan et al. | |
| 2009/0153652 A1 | 6/2009 | Barenbrug | |
| 2009/0322706 A1 | 12/2009 | Austin | |
| 2010/0044121 A1 | 2/2010 | Simon et al. | |
| 2010/0060552 A1 | 3/2010 | Watanabe et al. | |
| 2010/0073518 A1 | 3/2010 | Yeh | |
| 2010/0117949 A1 | 5/2010 | Lai et al. | |
| 2010/0118179 A1 | 5/2010 | Ciudad et al. | |
| 2010/0177179 A1 | 7/2010 | Behm et al. | |
| 2010/0182446 A1 | 7/2010 | Matsubayashi | |
| 2011/0050657 A1 | 3/2011 | Yamada | |
| 2011/0164047 A1 | 7/2011 | Pance et al. | |
| 2011/0248155 A1 | 10/2011 | Chen | |
| 2011/0279689 A1 | 11/2011 | Maglaque | |
| 2011/0285934 A1 | 11/2011 | Watanabe | |
| 2012/0074227 A1 | 3/2012 | Ferren et al. | |
| 2012/0105400 A1 | 5/2012 | Mathew et al. | |
| 2012/0287327 A1 | 11/2012 | Border et al. | |
| 2013/0135268 A1 | 5/2013 | Kanade et al. | |
| 2013/0135328 A1 | 5/2013 | Rappoport et al. | |
| 2013/0147764 A1* | 6/2013 | Chaji ................. H01L 27/3227 345/175 |
| 2013/0182062 A1* | 7/2013 | Son ........................ H04N 7/144 348/14.07 |
| 2013/0207896 A1 | 8/2013 | Robinson et al. | |
| 2013/0221856 A1 | 8/2013 | Soto | |
| 2013/0242479 A1 | 9/2013 | Yoo et al. | |
| 2013/0251215 A1 | 9/2013 | Coons | |
| 2013/0278516 A1 | 10/2013 | Nagata et al. | |
| 2013/0286152 A1* | 10/2013 | Hojer .................... H04N 7/144 348/14.01 |
| 2013/0321686 A1 | 12/2013 | Tan et al. | |
| 2013/0322752 A1 | 12/2013 | Lim et al. | |
| 2014/0036168 A1 | 2/2014 | Ludwig | |
| 2014/0208417 A1 | 7/2014 | Robinson et al. | |
| 2014/0232956 A1 | 8/2014 | Kwon et al. | |
| 2014/0267850 A1 | 9/2014 | Li et al. | |
| 2015/0035936 A1* | 2/2015 | Robinson ............... H04N 7/144 348/14.08 |
| 2015/0049165 A1* | 2/2015 | Choi ..................... H04N 7/144 348/14.16 |
| 2015/0212583 A1 | 7/2015 | Shen et al. | |
| 2015/0271392 A1 | 9/2015 | Musgrave et al. | |
| 2015/0279020 A1 | 10/2015 | Gupta et al. | |
| 2016/0180837 A1 | 6/2016 | Gustavsson et al. | |
| 2017/0084231 A1 | 3/2017 | Chew | |
| 2017/0123452 A1 | 5/2017 | Evans et al. | |
| 2017/0123453 A1 | 5/2017 | Evans et al. | |
| 2017/0123454 A1 | 5/2017 | Evans et al. | |
| 2017/0124932 A1 | 5/2017 | Evans et al. | |
| 2017/0124942 A1 | 5/2017 | Evans et al. | |
| 2017/0171448 A1 | 6/2017 | Evans et al. | |
| 2017/0330507 A1 | 11/2017 | Evans et al. | |
| 2018/0013944 A1 | 1/2018 | Evans et al. | |
| 2018/0107241 A1 | 4/2018 | Evans et al. | |

FOREIGN PATENT DOCUMENTS

| | | |
|---|---|---|
| CN | 106019671 A | 10/2016 |
| TW | 445744 B | 7/2001 |
| TW | 201001364 A | 1/2010 |
| TW | 201207535 A | 2/2012 |
| TW | M480123 U | 6/2014 |
| TW | 201523460 A | 6/2015 |
| WO | 2015097490 A1 | 7/2015 |

OTHER PUBLICATIONS

Non-Final Office Action dated Jun. 26, 2017, for U.S. Appl. No. 15/442,576 of Evans et al. filed Feb. 24, 2017.
Non-Final Office Action dated Jun. 6, 2017 for U.S. Appl. No. 15/231,643 of Evans, D.J. et al. filed Aug. 8, 2016.
Non-Final Office Action dated Feb. 16, 2017 in U.S. Appl. No. 15/231,664 of Evans et al.; 27 pages.
Non-Final Office Action dated Jun. 23, 2017 in U.S. Appl. No. 15/231,664 of Evans et al.
Notice of Allowance dated May 19, 2017, for U.S. Appl. No. 15/283,112 of Evans et al. filed Sep. 30, 2016, 8 pages.
Notice of Allowance dated May 26, 2017, for U.S. Appl. No. 15/336,380 of Evans, J.D. et al. filed Oct. 27, 2017.
U.S. Appl. No. 15/444,320 of Evans et al. filed Feb. 27, 2017, 82 pages.
International Search Report and Written Opinion in PCT/US16/59550 dated Jan. 3, 2017 10 pages.
International Search Report and Written Opinion in PCT/US16/58543 dated Jan. 3, 2017 12 pages.

(56) References Cited

OTHER PUBLICATIONS

International Search Report and Written Opinion in PCT/US16/58545 dated Jan. 3, 2017 12 pages.
Non-Final Office Action dated Dec. 15, 2016 in U.S. Appl. No. 15/283,112 of Evans et al. filed Sep. 30, 2016 26 pages.
Final Office Action dated Apr. 26, 2017 in U.S. Appl. No. 15/231,652 of Evans et al. filed Aug. 8, 2016 32 pages.
Final Office Action dated Mar. 31, 2017 in U.S. Appl. No. 15/231,643 of Evans et al. filed Aug. 8, 2016 32 pages.
Final Office Action dated Apr. 11, 2017 in U.S. Appl. No. 15/231,664 of Evans et al. filed Aug. 8, 2016 36 pages.
Non-Final Office Action dated Jan. 5, 2017 in U.S. Appl. No. 15/231,643 of Evans et al. filed Aug. 8, 2016 37 pages.
Advisory Action dated May 12, 2017, for U.S. Appl. No. 15/231,643 of Evans et al. filed Aug. 8, 2016 4 pages.
International Search Report and Written Opinion in PCT/US16/58548 dated Jan. 19, 2017 8 pages.
International Search Report and Written Opinion in PCT/US16/58947 dated Jan. 13, 2017 9 pages.
International Search Report and Written Opinion dated May 18, 2017, for International Application No. PCT/US2017/19790 filed Feb. 27, 2017, 8 pages.
Evans V, et al., International Search Report and Written Opinion received in PCT Application No. PCT/US16/59524, dated Feb. 27, 2017; 10 pages.
Evans V, et al., Non-Final Office Action mailed in U.S. Appl. No. 15/336,380 dated Mar. 14, 2017; 17 pages.
Evans V, et al., Non-Final Office Action received in U.S. Appl. No. 15/231,652 of Evans et al. dated Feb. 24, 2017; 26 pages.
Advisory Action dated Jul. 6, 2017, for U.S. Appl. No. 15/283,204 of Evans et al. filed Sep. 30, 2016.
Decision to Grant dated Mar. 6, 2018 for Taiwan Application No. 105135139 of Essential Products, Inc.
Non-Final Office Action dated Feb. 23, 2018 for Taiwan Application No. 105134986 of Essential Products, Inc.
Non-Final Office Action dated Mar. 1, 2018 for U.S. Appl. No. 15/442,576 of Evans et al.
Office Action dated Feb. 13, 2018 for Taiwan Patent Application No. 105134992 of Essential Products, Inc.
Corrected Notice of Allowability dated Nov. 16, 2017 for U.S. Appl. No. 15/444,320 of Evans et al., filed Feb. 27, 2017.
Non-Final Office Action dated Nov. 9, 2017 for U.S. Appl. No. 15/665,359 of Evans et al., filed Jul. 31, 2017.
Non-Final Office Action dated Sep. 21, 2017 for TW Application No. 105134992 of Evans et al., filed Oct. 28, 2016.
Notice of Allowance dated Aug. 1, 2017, for U.S. Appl. No. 15/444,320 of Evans et al. filed Feb. 27, 2017.
Notice of Allowance dated Aug. 30, 2017 for U.S. Appl. No. 15/231,643 of Evans et al., filed Oct. 30, 2016.
Notice of Allowance dated Jul. 14, 2017 in U.S. Appl. No. 15/231,652 of Evans et al. filed Aug. 8, 2016.
Notice of Allowance dated Nov. 9, 2017 for U.S. Appl. No. 15/442,576 of Evans et al., filed Feb. 24, 2017.
Notice of Allowance dated Sep. 13, 2017 for U.S. Appl. No. 15/231,664 of Evans et al. filed Aug. 8, 2016.
Office Action dated Nov. 10, 2017 for TW Application No. 105134991 of Evans et al., filed Oct. 28, 2016.
Supplemental Notice of Allowance dated Sep. 19, 2017 for U.S. Appl. No. 15/444,320 of Evans et al., filed Feb. 27, 2017.
Int'l Preliminary Report on Patentability dated May 11, 2018 for PCT Patent Application No. PCT/US2016/058543 of Essential Products, Inc.
Int'l Preliminary Report on Patentability dated May 11, 2018 for PCT Patent Application No. PCT/US2016/058545 of Essential Products, Inc.
Int'l Preliminary Report on Patentability dated May 11, 2018 for PCT Patent Application No. PCT/US2016/059550 of Essential Products, Inc.
Notice of Allowance dated Jun. 4, 2018 for Taiwan Patent Application No. 105134986 of Essential Products, Inc.
Non-Final Office Action dated Jun. 20, 2018 for U.S. Appl. No. 15/712,034 of Evans et al.
Notice of Allowance dated Apr. 25, 2018 for U.S. Appl. No. 15/665,359 of Evans et al.
Office Action dated Jan. 25, 2018 for Taiwan Patent Application No. 105135139 of Essential Products, Inc.
Office Action and Search Report dated Jul. 20, 2018 for Taiwan Patent Application No. 105135212 of Essential Products, Inc.

\* cited by examiner

MOBILE DEVICE WITH DISPLAY OVERLAID WITH AT LEAST A LIGHT SENSOR

CROSS-REFERENCE TO RELATED APPLICATION(S)

This application incorporates by reference U.S. Provisional Patent Application No. 62/249,130, filed on Oct. 30, 2015, U.S. Provisional Application No. 62/300,631, filed on Feb. 26, 2016, U.S. Provisional Application No. 62/319,099, filed on Apr. 6, 2016, and U.S. Provisional Application No. 62/373,910, filed on Aug. 11, 2016, all of which are incorporated by reference herein in their entirety.

RELATED FIELD

At least one embodiment of this disclosure relates generally to a mobile device, and in particular to a mobile device with a camera and a display.

BACKGROUND

A conventional mobile device, such as a tablet and a smartphone, generally has a display and an input component. The input component can include mechanical buttons or tracking devices (e.g., a track ball). In some cases, the input component includes a touchscreen overlaid with display. A mobile device can also include a camera. Generally, the camera is disposed adjacent to the display and/or a touchscreen, either facing the same direction as the display (e.g., convenient for using the mobile device to simulate a mirror) or facing the opposite direction as the display (e.g., convenient for using the mobile device to take pictures).

SUMMARY

Various embodiments include a mobile device with a display overlaid with at least a light sensor (e.g., part of a camera or a proximity sensor system). In some embodiments, the camera is disposed underneath the display (e.g., away from the displaying surface). The display can be an opaqueness adjustable display having a matrix of light emitting pixels. The display can have the capability of turning substantially transparent, substantially opaque, or therebetween, responsive to a command from a processor of the mobile device. In some embodiments, the opaqueness adjustable display can be an organic light emitting diode (OLED) display. In these embodiments, the display is substantially opaque when an organic emissive layer is emitting light, and thus making an otherwise transparent display opaque. In some cases, the organic emissive layer can emit light in one direction, causing the display to be opaque in only one direction. In other embodiments, the display is a liquid crystal display (LCD). In these embodiments, the display is substantially opaque when a liquid crystal is switched on and thus blocking light through two polarizing filters. The display is substantially transparent when the liquid crystal is switched off, and thus rotating light passing through it by 90 degrees, effectively allowing light to flow through two polarizing filters.

In some embodiments, the camera is disposed above (e.g., instead of underneath) the display. In these embodiments, the camera is comprised of transparent components to enable the light rays generated from the display to pass through the body of the camera.

In some embodiments, a matrix of sensors for the camera is integrated with a region of the display such that the color pixels are positioned with in the same layer as the camera sensors. For example, for each light emitting pixel within the region, there can be one or more corresponding sensors of the camera disposed adjacent thereto.

In some embodiments, the light emitting pixels generate directional or semi-directional light such that illumination generated by portions of the opaqueness adjustable display substantially does not influence the accuracy of the images captured by the camera. In some embodiments, the camera is configured with directional sensors such that the images captured by the camera are not substantially influenced by peripheral light rays generated by the opaqueness adjustable display. In some embodiments, the processor is configured to post-process the images captured by the camera sensors to remove the effects of the display when at least a portion of the display is active (e.g., emitting light) when the images are captured by the camera.

Some embodiments of this disclosure have other aspects, elements, features, and steps in addition to or in place of what is described above. These potential additions and replacements are described throughout the rest of the specification

The figures depict various embodiments of this disclosure for purposes of illustration only. One skilled in the art will readily recognize from the following discussion that alternative embodiments of the structures and methods illustrated herein may be employed without departing from the principles of the invention described herein.

DETAILED DESCRIPTION

Figure 1A:
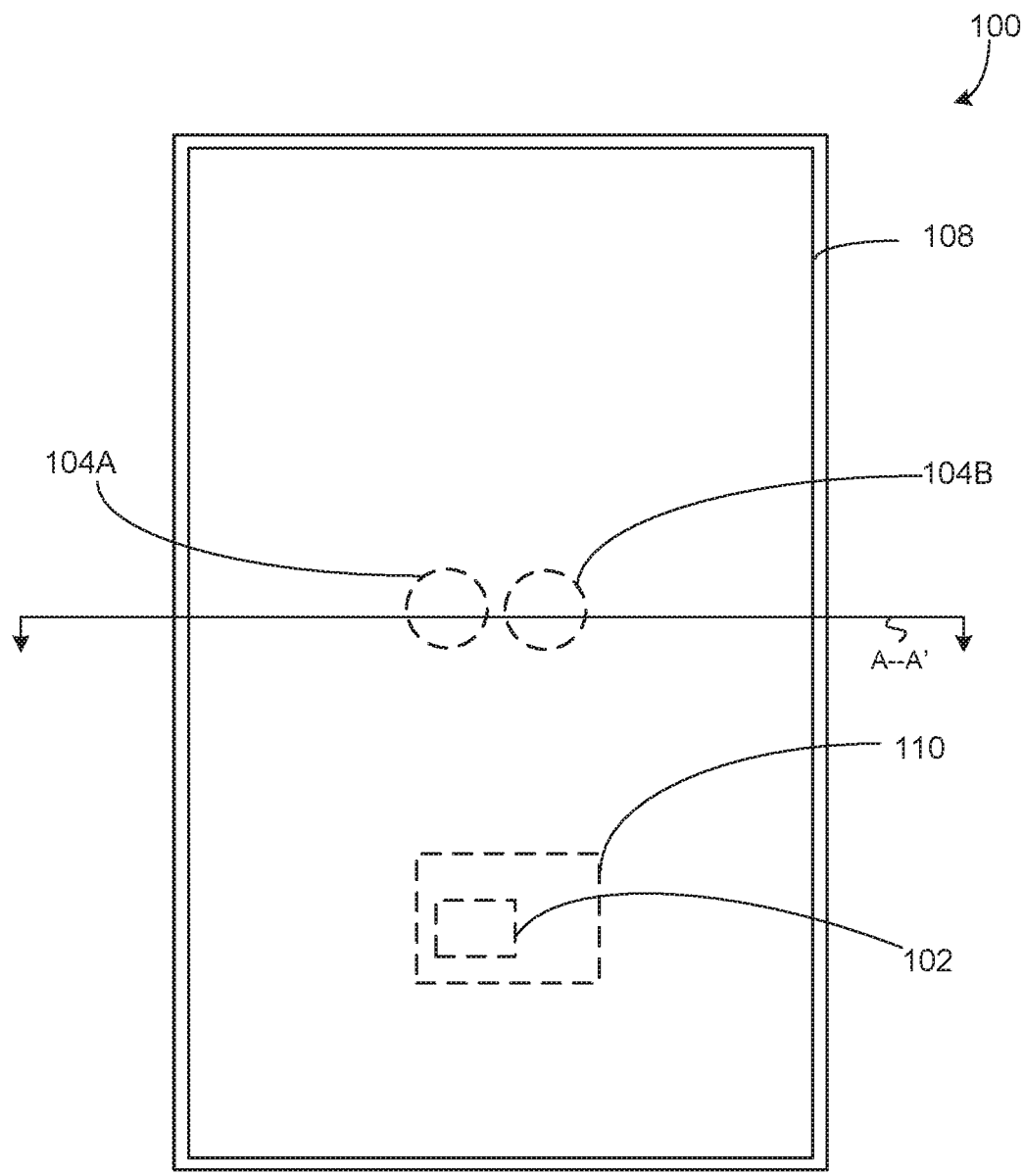
FIG. 1A is a top plan view diagram of a mobile device, in accordance with various embodiments.

FIG. 1A is a top plan view diagram of a mobile device 100, in accordance with various embodiments. The mobile device 100 can include a processor 102 (shown in dashed lines). The mobile device 100 includes one or more cameras (e.g., a camera 104A and/or a camera 104B, collectively as the "cameras 104") and a display 108. The one or more cameras 104 and the processor 102 are illustrated in dashed lines to denote that the cameras 104 and the processor 102 are within the mobile device 100 and underneath the display 108. The processor 102 can be part of a control circuitry 110.

The cameras 104 can be sealed within the mobile device 100. In some embodiments, the one or more cameras 104 includes multiple cameras (as shown), such as the camera 104A and the camera 104B, to provide depth perception to the mobile device 100. For example, the processor 102 can utilize the difference between the images captured by the cameras 104 at the same time to determine depth information of subjects captured within the images. Although the mobile device 100 is illustrated to have multiple cameras, in some embodiments, the mobile device 100 includes only a single camera (e.g., the camera 104A). In these embodiments, the single camera can be positioned in the center of the display 108. The one or more cameras 104 can face the same direction as the display 108, such that the cameras 104 are capable of capturing an image of a viewer while the viewer is looking at the display 108.

Figure 1B:
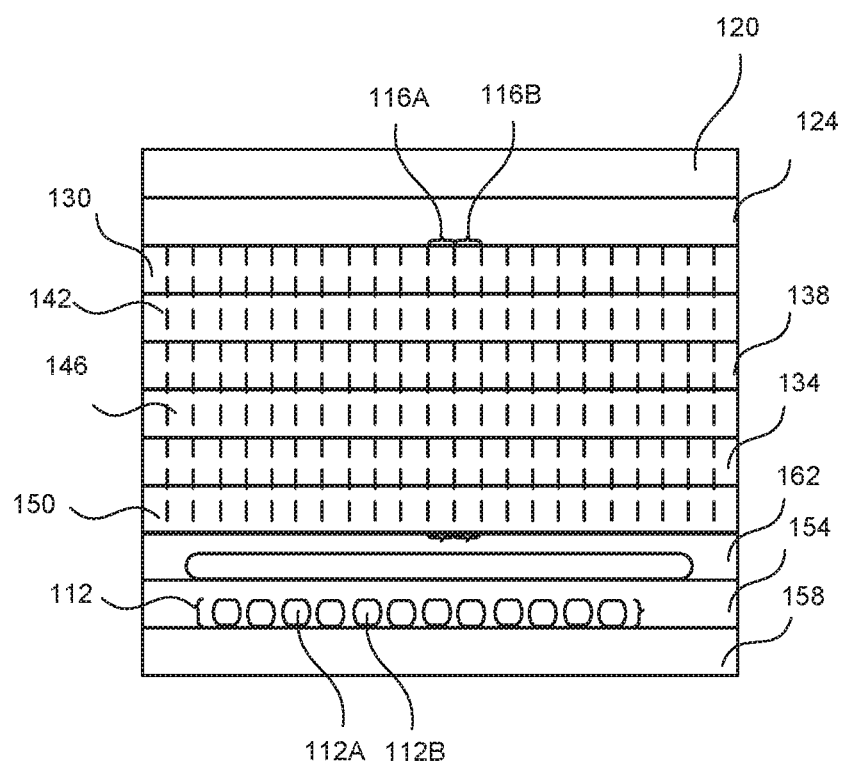
FIG. 1B is a cross-sectional side view diagram of the mobile device of FIG. 1A, in accordance with some embodiments.

FIG. 1B is a cross-sectional side view diagram of the mobile device 100 of FIG. 1A, in accordance with some embodiments. FIG. 1B can illustrate a cross-sectional view along lines A-A' in FIG. 1A. The display 108 is an opaqueness adjustable display. The cameras 104 can include a matrix of light sensors 112 (e.g., light sensor 112A, light sensor 112B, etc., collectively as the "light sensors 112"). In some embodiments, each of the light sensors 112 can be adapted to capture an optical wavelength range representative of a particular color (e.g., visible or near visible color, such as infrared or ultraviolet).

The display 108 can include a matrix of color pixels 116 (e.g., color pixel 116A, color pixel 116B, etc., collective as the "color pixels 116"). For example, the matrix of color pixels 116 can be an OLED display matrix. Each of the color pixels 116 can individually change intensity. In some embodiments, each of the color pixels 116 can individually change color. The matrix of color pixels 116 can cover a greater area than the matrix of light sensors 112. The light sensors 112 and the color pixels 116 can be directional. The light sensors 112 and the color pixels 116 can be oriented toward the same direction or substantially the same direction. In some embodiments, the display 108 is part of a touchscreen system, such as a capacitive touchscreen or a resistive touchscreen. The display 108 can be coupled to a screen substrate 120. The screen substrate 120 is transparent and can include a smooth surface. The screen substrate 120 can composed of at least glass or plastic. In some embodiments, the screen substrate 120 is coated with a transparent conductor. The screen substrate 120 can be exposed on an outer surface of the mobile device 100, while the display 108 and the cameras 104 are protected with a chassis (not shown) of the mobile device 100 and the screen substrate 120. "Transparency" and "opaqueness" as discussed in this disclosure can refer to the detectability of light, within the visible spectrum and external to the mobile device 100, by the cameras 104. "Transparency" and "opaqueness" can also refer to the detectability of light within a target spectrum intended to be captured by the cameras 104.

In various embodiments, the display 108 and the cameras 104 are controlled by the control circuitry 110 (e.g., processor 102) of the mobile device 100. The processor 102 can command the display 108 to render at least a subset of the matrix of color pixels transparent or substantially transparent. For example, the subset can represent a contiguous region of the display 108 directly over the camera(s) 104. In response, the processor 102 can command the camera(s) 104 to capture an image or video for processing while the contiguous region is transparent or substantially transparent.

Mobile Device Stack with OLED Display

The screen substrate 120 can be the outermost layer of the mobile device 100. In some embodiments, the screen substrate 120 is coated with one or more material to change the optical or electrical properties of the screen substrate 120. For example, the coating can provide protection, anti-reflective property, electrically conductive property, light polarizing property, or any combination thereof. A touch sensor layer 124 can be disposed adjacent (e.g., immediately adjacent) to the screen substrate 120. In the illustrated embodiment, the touch sensor layer 124 is disposed immediately underneath the screen substrate 120 and in contact with the screen substrate 120. In some embodiments, the touch sensor layer 124 can be spaced apart from the screen substrate 120. In various embodiments, the screen substrate 120 and the touch sensor layer 124 are substantially transparent (e.g., at least in the visible spectrum).

In some embodiments, the touch sensor layer 124 can be above the screen substrate 120. In these embodiments, the touch sensor layer 124 can be coated with a protective coating. In these embodiments, driving signals to the touch sensor layer 124 and sensing signals from the touch sensor layer 124 can be routed from the control circuitry 110 of the mobile device 100 through holes in the screen substrate 120 or adjacent to the edges of the screen substrate 120.

Underneath the screen substrate 120 and the touch sensor layer 124 can be a plurality of layers that make up the display 108. For example, the display 108 can include an anode layer 130, one or more organic layers, and a cathode layer 134. The anode layer 130 and the cathode layer 134 can be referred to as the "electrode layers." The organic layers can be sandwiched between the anode layer 130 and the cathode layer 134. The organic layers can include an emissive layer 138 and one or more conductive layers (e.g., an anode-side layer 142 and a cathode-side layer 146). The anode-side layer 142 can be a hole injection layer, a hole transport layer, an electron blocking layer, or any combination thereof. The cathode-side layer 146 can be an electron injection layer, an electron transport layer, a hole blocking layer, or any combination thereof. The emissive layer 138 is adapted to emit light in response to an electric current. The emissive layer 138 can be comprised of organic electroluminescent material. In various embodiments, the organic layers are substantially transparent in at least the visible spectrum.

In some embodiments, the display 108 is an active matrix organic light emitting diode (AMOLED) displayed. The AMOLED display can be controlled by a thin film transistor (TFT) layer 150. In various embodiments, the TFT layer 150 includes circuitry that takes up a small enough of real estate that such that external light is substantially transmittable through the TFT layer 150.

The stack of the mobile device 100 can also include a light sensor layer 154 and a control circuit layer 158. The control circuit layer 158 can include the control circuitry 110, including the processor 102. The light sensors 112 can be implemented in the light sensor layer 154. The light sensor layer 154 can include one or more cameras, such as the camera 104A and/or the camera 104B (e.g., each implemented as a matrix of light sensors). In some embodiments, the light sensor layer 154 includes a proximity sensor (e.g., one of the light sensors 112). Optionally, the stack of the mobile device 100 can also include an optics layer 162 to transform light captured by the light sensor layer 154. The optics layer 162 can be part of the camera 104A and/or the camera 104B.

In some embodiments, the relative positions of the anode layer 130 and the cathode layer 134 can be flipped (e.g., either the cathode layer 134 being closer to the screen substrate 120 or the anode layer 130 being closer to the screen substrate 120). In these embodiments, the cathode-side layer 146 is still positioned adjacent to (e.g., in physical and/or electrical contact with) the cathode layer 134 and the anode-side layer 142 is still positioned adjacent to (e.g., in physical and/or electrical contact with) the anode layer 130.

In some embodiments, both the anode layer 130 and the cathode layer 134 are substantially transparent (e.g., at least in the visible spectrum). For example, the anode layer 130 and/or the cathode layer 134 can be comprised of an indium tin oxide (ITO) layer of transparent and electrically conductive material. In other examples, the anode layer 130 and/or the cathode layer 134 can be comprised of other transparent and electrically conductive material.

In some embodiments, only one of the anode layer 130 and the cathode layer 134 is substantially transparent (e.g., at least in the visible spectrum). For example, at least one of the anode layer 130 and the cathode layer 134 can be fully metallic while the other is an electrically conductive and transparent material (e.g., ITO or an electrically conductive ceramic or glass). The fully metallic layer can be referred to as the "metallic electrode layer." In these embodiments, the light sensor layer 154 can be disposed above or in plane with the metallic electrode layer (e.g., such that the opaqueness of the metallic electrode layer does not interfere with the light sensors 112's ability to capture light from beyond the screen substrate 120 away from the display 108. In some embodiments, the real estate footprint of the metallic electrode layer can be reduced such that the layer is mostly empty and thus considered "substantially transparent" from the perspective of the cameras 104. The empty regions can also be filled with other transparent material (e.g., transparent within the visible spectrum).

Figure 2A:
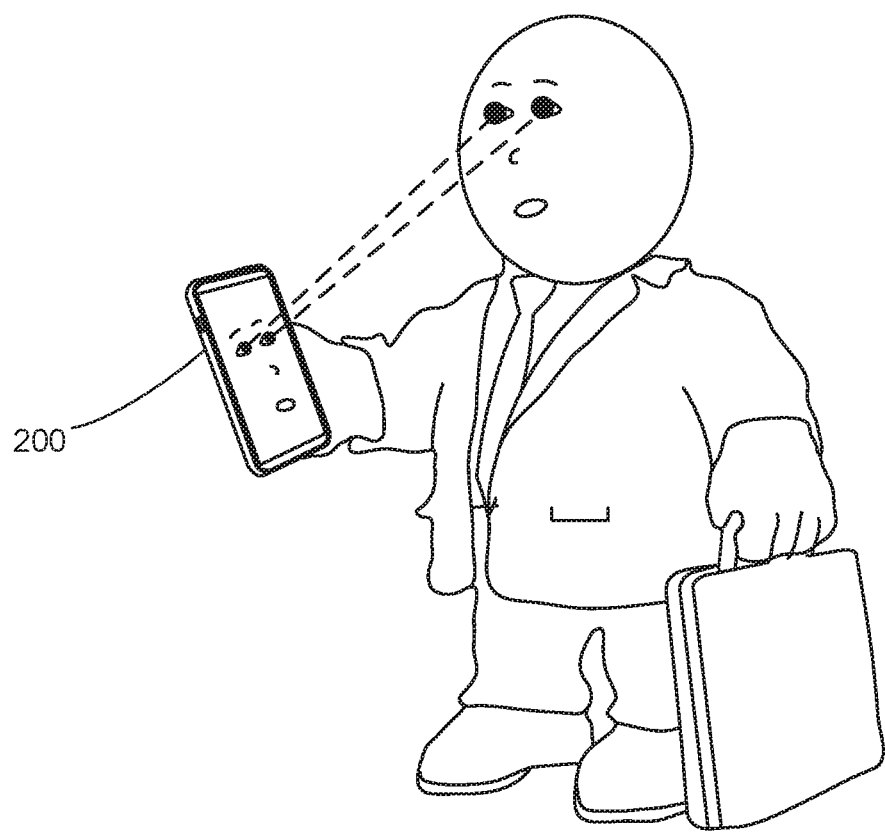
FIG. 2A is a diagram illustrating an example application in a mobile device that utilizes a display overlaid with a camera for video conferencing, in accordance with some embodiments.

FIG. 2A is a diagram illustrating an example application in a mobile device 200 that utilizes a display (e.g., the display 108) overlaid with a camera (e.g., the camera 104A and/or the camera 104B) for video conferencing, in accordance with some embodiments. The display and the camera can be part of the mobile device 200 (e.g., the mobile device 100). In this example application, because the camera is underneath the display, instead of adjacent to the display as in conventional mobile devices, the camera can be positioned at or closer to the center (e.g., in the middle) of the display. This enables the mobile device to display an image of an external user whose face is approximately overlaid over the camera. This enables a videoconference application where the user of the mobile device can maintain eye contact with the external user.

In some embodiments, the mobile device can adjust the display to be substantially transparent briefly between consecutive frames of a video feed from the external device. The duration that the display is substantially transparent can be short enough that the brief transparency is imperceptible to human eyes (e.g., normal human eyes or any human eyes).

Figure 2B:
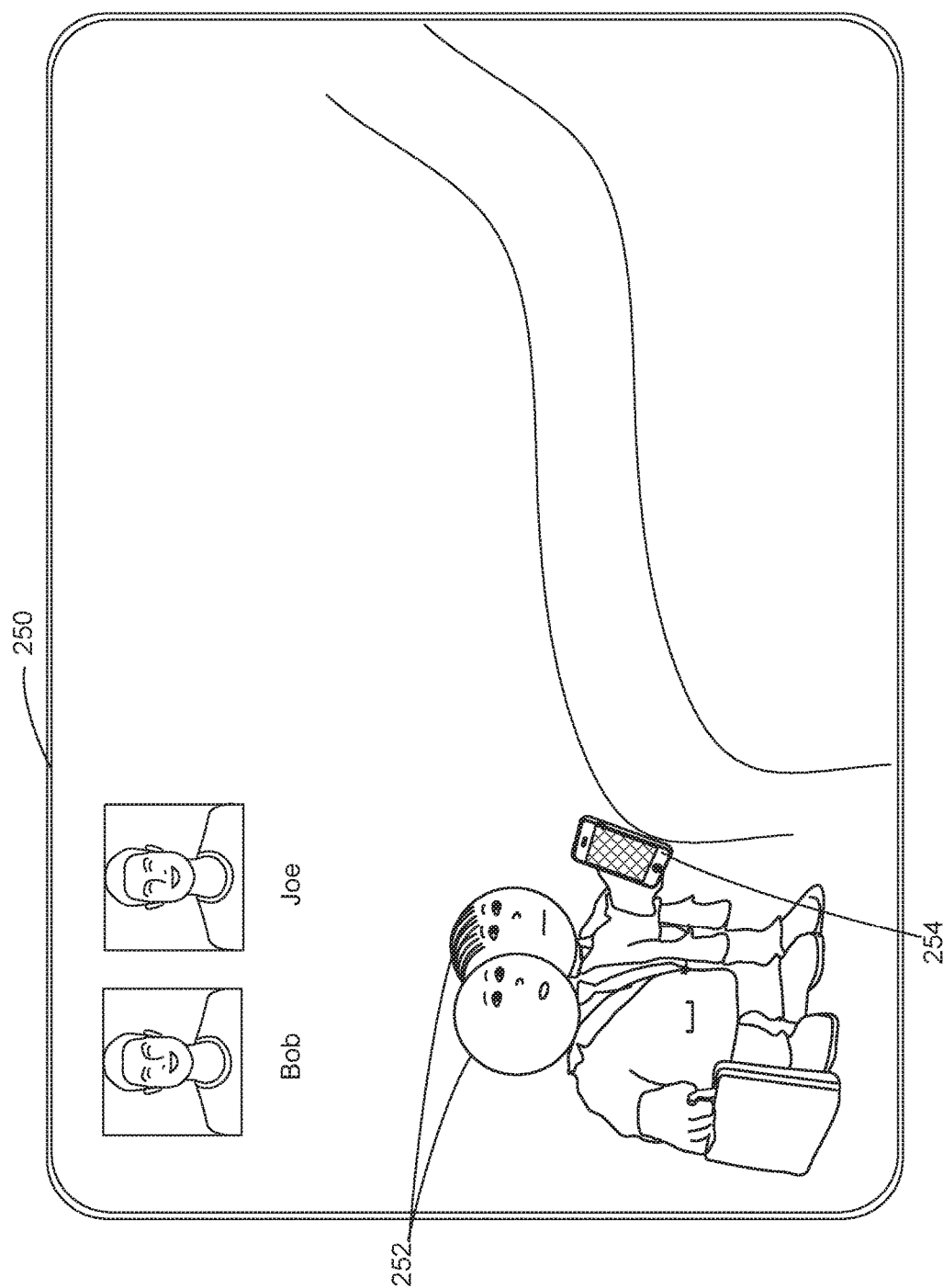
FIG. 2B is a diagram illustrating an example application in a mobile device that utilizes a display overlaid with a camera for augmented reality or reverse augmented reality, in accordance with some embodiments.

FIG. 2B is a diagram illustrating an example application in a mobile device 250 that utilizes a display (e.g., the display 108) overlaid with a camera (e.g., the camera 104A and/or the camera 104B) for augmented reality or reverse augmented reality, in accordance with some embodiments. The display and the camera can be part of a mobile device (e.g., the mobile device 100). Utilizing the same technology described above, the mobile device can adjust the display to be substantially transparent briefly between consecutive frames of a video environment. In one example, the video environment is a rendition of the real world as observed by the camera with virtual objects added to it. In another example, the video environment is a rendition of a virtual world with one or more real-world objects added to it. In the illustrated example, the mobile device 250 renders an image 252 of two people facing the camera of the mobile device 250, including one person holding a rendered representation 254 of the mobile device 250 itself.

Figure 3:
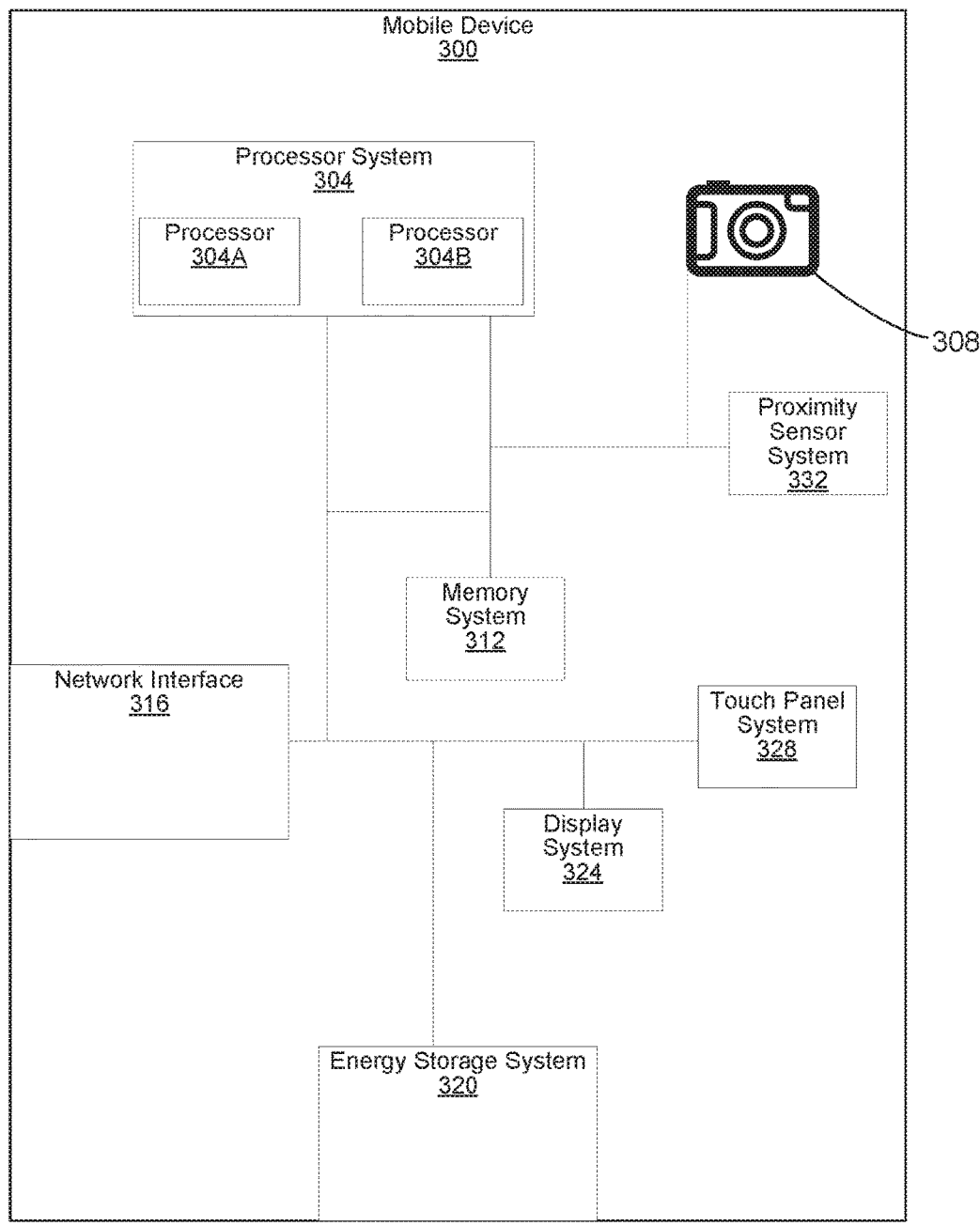
FIG. 3 is a block diagram of a mobile device, in accordance with various embodiments.

FIG. 3 is a block diagram of a mobile device 300 (e.g., the mobile device 100, the mobile device 200, and/or the mobile device 250), in accordance with various embodiments. The mobile device 300 can include a processor system 304, a camera 308 (e.g., one of the cameras 104), a memory system 312, a network interface 316, an energy storage system 320, a display system 326 (e.g., part of the display 108), a touch panel system 328 (e.g., part of the display 108), a proximity sensor system 332, or any combination thereof. The processor system 304 can include one or more processors (e.g., a processor 304A and a processor 304B, collectively as the "processors 304"). In some embodiments, the processors 304 are processor cores in a single central processing unit (CPU). In some embodiments, the processors 304 are independent processors.

The memory system 312 can include volatile memory, persistent/nonvolatile memory, random access memory, solid state memory, or any combination thereof. The memory system 312 is capable of storing digital data for the processor system 304. For example, the memory system 312 can store images and photographs taken by the camera 308. For another example, the memory system 312 can store executable instructions that can configure the processor system 304 to implement various functional components. In some embodiments, the memory system 312 includes a storage adapter. The storage adapter enables the mobile device 300 to access a portable data storage (e.g., an external memory card) that can be coupled to the memory system 312.

The network interface 316 provides the mobile device 300 with the ability to communicate with remote devices, over a wired and/or a wireless network. The network interface 316 can include a network adapter, such as an Ethernet adapter or Fibre Channel adapter. The network interface 316 may also provide the mobile device 300 with the ability to communicate with other computers.

The camera 308 is a component device for recording visual images in the form(s) of photograph, film, and/or video. Optical instruments of the camera can record the images in a digital format to be stored in the memory system 312 or to be transmitted to an external device via the network interface 316.

The energy storage system 320 can power the processor system 304, the memory system 312, the network interface 316, the camera 308, or any combination thereof. For example, the energy storage system 320 can include a battery and/or a battery compartment. In some embodiments, the energy storage system 320 can be rechargeable.

A display system 324 (e.g., part of the display 108) can visually represent still or moving images based on one or more commands from the processor system 304. For example, the display system 324 can toggle individual pixels of the display 108. A touch panel system 328 (e.g., part of the display 108) can detect tactile contacts or near tactile contacts on a display screen of the mobile device 300. The touch panel system 328 can detect tactile contacts or near tactile contacts (e.g., with detectable change in the electric characteristic (e.g., capacitance or resistance) of a region of the touch panel system 328). The touch panel system 328 can detect the tactile contacts or near tactile contacts with respect to a coordinate system that corresponds to the pixels of the display 108. a proximity sensor system 332 can be a separate system from the camera 308 or the same system as the camera 308. The proximity sensor system 332 can detect proximity of an object external to the mobile device 300 and the movement of the object. For example, the proximity sensor system 332 can include light sensors at different locations to detect three-dimensional (3D) gestures.

Figure 4:
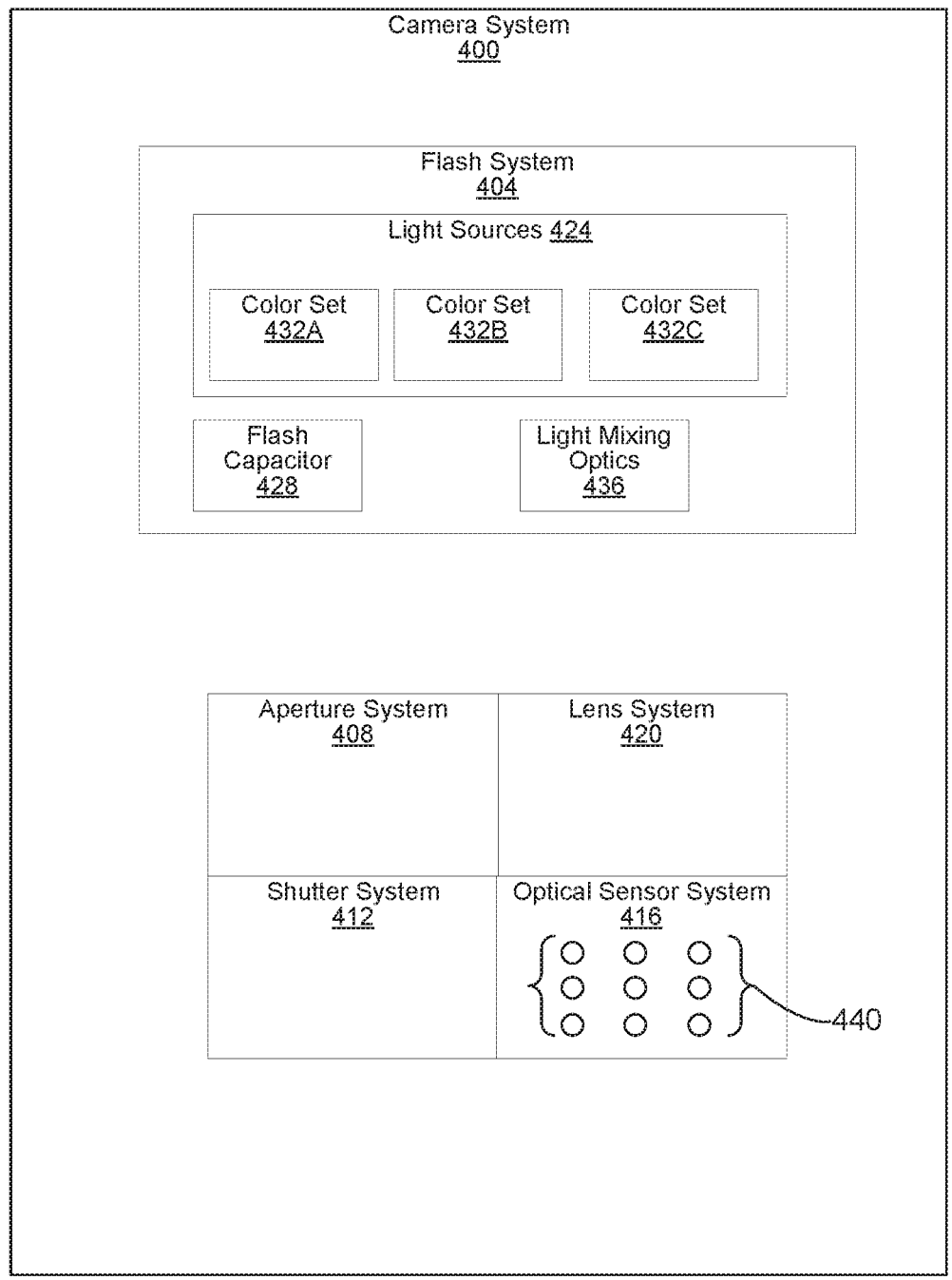
FIG. 4 is a block diagram of a camera in a mobile device, accordance with various embodiments.

FIG. 4 is a block diagram of a camera 400 (e.g., the camera 104A, the camera 104B, and/or the camera 308) in a mobile device (e.g., the mobile device 100, the mobile device 200, the mobile device 250, and/or the mobile device 300), accordance with various embodiments. The camera 400 can include a flash system 404, an aperture system 408, a shutter system 412, an optical sensor system 416, a lens system 420, or any combination thereof. In some embodiments, the camera 400 does not include the aperture system 408. In some embodiments, the camera 400 does not include the shutter system 412. The flash system 404 can include one or more light sources 424 (e.g., light emitting component devices). In some embodiments, the light sources 424 are part of the display 108. For example, the light sources 424 can include one or more of the color pixels 116. In some embodiments, the flash system 404 can be part of a display matrix (e.g., the display 108 comprised of the color pixels 116). In some embodiments, the flash system 404 can reside underneath the display matrix (e.g., above or in plane with the optics layer 162).

The light sources can be light emitting diodes and/or light bulbs. In some embodiments, the flash system 404 includes a flash capacitor 428. For example, the mobile device can charge the flash capacitor 428 with its power source. The flash capacitor 428 enables the flash system 404 to provide a large amount of electrical current to the light sources 424 that the power source of the mobile device cannot otherwise provide.

In some embodiments, the light sources 424 can be divided into multiple color sets (e.g., a color set 432A, a color set 432B, and a color set 432C, collectively as the "color sets 432"). One or more light sources in each of the color sets 432 can produce substantially same color. In one example, the color set 432A can correspond to red, the color set 432B can correspond to green, and the color set 432C can correspond to blue. In another example, the color set 432A can correspond to white, the color set 432B can correspond to a warm hue (e.g., amber), and the color set 432C can correspond to a cool hue (e.g., blue). The flash system 404 can include circuitry to drive each of the color sets 432 with different electric current levels to produce different intensity from each of the color sets 432. In some embodiments, the flash system 404 includes circuitry to drive the color sets 432 and/or the light sources 424 individually. In some embodiments, the flash system 404 includes one or more light mixing optics 436 to make the light produced from the color sets 432 well blended (e.g., with its component light sources substantially invisible).

The aperture system 408 can control a lens diaphragm opening over the lens system 420. The size of the diaphragm opening can be regulated by the camera 400 automatically or based on one or more commands from the mobile device. The size of the diaphragm opening can regulate the amount of light passes through onto the optical sensor system 416 inside the camera 400. In some embodiments, the aperture system 408 and/or the shutter system 412 can be under the display (e.g., the display 108) of a mobile device.

The shutter system 412 controls how long the optical sensor system 416 is exposed to light. The optical sensor system 416 can capture a photograph by opening and closing a gate of the shutter system 412. The camera 400 can capture consecutive images by repeatedly opening and closing the gate of the shutter system 412. For example, the shutter system 412 can use a pair of "curtains" or "blinds." One of the blinds can open to start the exposure, and the other blind is closed to end the exposure. In some embodiments, the aperture system 408 and/or the shutter system 412 can be above or in plane with the display (e.g., the display 108) of a mobile device.

The optical sensor system 416 includes a matrix of optical sensors 440 (e.g., the light sensors 112). Each of the optical sensors 440 is a sensor that detects and conveys information that constitutes at least a pixel of an image. For example, the optical sensors 440 can convert the variable attenuation of waves (e.g., as they pass through or reflected off of objects) into electrical signals. The converted electrical signals can be saved in a digital format according to the relative positions of the optical sensors 440. In some embodiments, the optical sensor system 416 includes optical filters (e.g., color filters). In some embodiments, sets of the optical sensors 440 are specialized to detect particular color types.

The lens system 420 includes one or more lens assemblies used in conjunction with the optical sensor system 416. For example, the lens system 420 can focus light from surrounding area onto the optical sensor system 416.

Physical and functional components (e.g., devices, engines, modules, and data repositories, etc.) associated with the mobile device 100, the mobile device 200, the mobile device 250, the mobile device 300, and/or the camera 400 can be implemented as circuitry, firmware, software, other executable instructions, or any combination thereof. For example, the functional components can be implemented in the form of special-purpose circuitry, in the form of one or more appropriately programmed processors, a single board chip, a field programmable gate array, a general-purpose computing device configured by executable instructions, a virtual machine configured by executable instructions, a cloud computing environment configured by executable instructions, or any combination thereof. For example, the functional components described can be implemented as instructions on a tangible storage memory capable of being executed by a processor or other integrated circuit chip. The tangible storage memory can be computer readable data storage. The tangible storage memory may be volatile or non-volatile memory. In some embodiments, the volatile memory may be considered "non-transitory" in the sense that it is not a transitory signal. Memory space and storages described in the figures can be implemented with the tangible storage memory as well, including volatile or non-volatile memory.

Each of the components may operate individually and independently of other components. Some or all of the functional components may be executed on the same host device or on separate devices. The separate devices can be coupled through one or more communication channels (e.g., wireless or wired channel) to coordinate their operations. Some or all of the components may be combined as one component. A single component may be divided into sub-components, each sub-component performing separate method step or method steps of the single component.

In some embodiments, at least some of the components share access to a memory space. For example, one component may access data accessed by or transformed by another component. The components may be considered "coupled"

to one another if they share a physical connection or a virtual connection, directly or indirectly, allowing data accessed or modified by one component to be accessed in another component. In some embodiments, at least some of the components can be upgraded or modified remotely (e.g., by reconfiguring executable instructions that implements a portion of the components). Other arrays, systems and devices described above may include additional, fewer, or different components for various applications.

Figure 5:
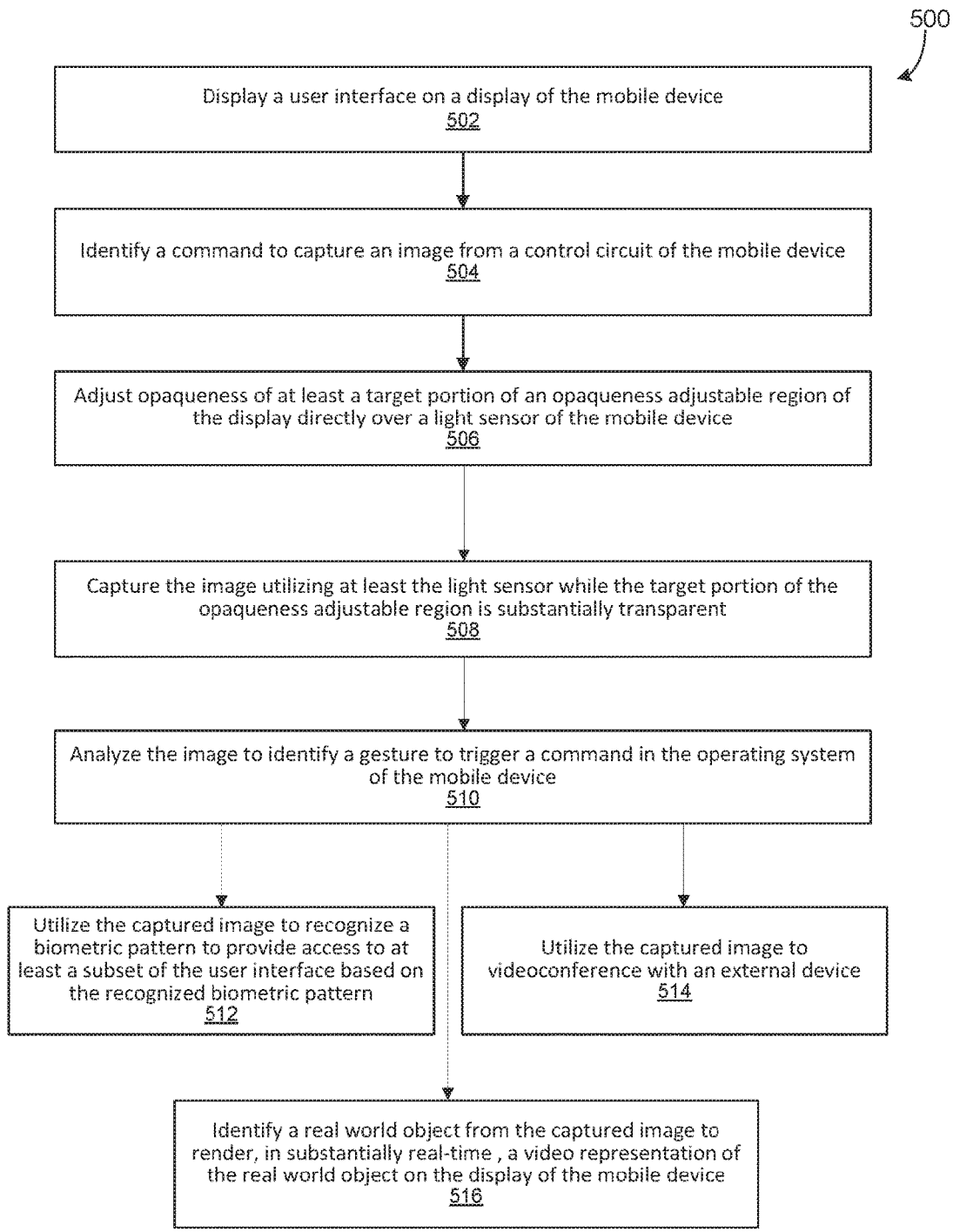
FIG. 5 is a flow chart of a method of operating a mobile device to utilize a light sensor overlaid with a display, in accordance with various embodiments.

FIG. 5 is a flow chart of a method 500 of operating a mobile device to utilize a light sensor (e.g., as part of a camera or a proximity sensor system) overlaid with a display, in accordance with various embodiments. At step 502, the mobile device can display a user interface on a display of the mobile device. The user interface can take up an entire screen of the display.

At step 504, the mobile device can identify a command to capture an image from a control circuit of the mobile device. For example, the command can be in response to detecting an input event utilizing an input sensor of the mobile device. Detecting the input event can include detecting a touch event on the user interface utilizing a touch sensor integrated with the display.

At step 506, the mobile device can adjust opaqueness of at least a target portion of an opaqueness adjustable region of the display directly over a light sensor of the mobile device. This adjustment can be in response to the identified command and/or detecting an input event. The opaqueness adjustable region is capable of transforming from substantially opaque to substantially transparent and vice versa. The light sensor can be part of a video camera, a still image camera, a proximity sensor system, an optical biometric sensor system, an optical gesture detection system, or any combination thereof.

For example, the mobile device can turn at least the target portion substantially transparent. The mobile device can turn at least the target portion of the region more transparent than a time prior to identifying the command. While adjusting the opaqueness, the mobile device can keep the target portion substantially transparent for substantially a duration needed to capture the image according to the command.

In some embodiments, the mobile device can display an opaque portion within the opaqueness adjustable region of the display while the target portion of the opaqueness adjustable region is rendered substantially transparent. In some embodiments, the opaque portion presents a pattern (e.g., a grating or a lens flare pattern), a color, an image, or any combination thereof, to serve as an optical filter for the light sensor. For example, the mobile device can cause the display to produce a consistent pattern, color, or shade while capturing the image to add an effect to the captured image. To add an effect to the captured image, the mobile device can adjust the color, shade, and/or pattern of the display over the target portion during a time an aperture system (the aperture system 408) and/or a shutter system (e.g., the shutter system 412) of the camera is opened to enable light to fall on the light sensor of the camera. The consistent pattern, color, or shade can be configured to improve gesture detection from the image. The consistent pattern, color, or shade can be configured to provide a filter gradient to the image.

In some embodiments, adjusting the opaqueness includes turning at least the target portion substantially translucent. In these embodiments, the mobile device can display a translucent image over the target portion while capturing, via at least the light sensor, an image through the translucent display. In some embodiments, the mobile device can adjust the color, shade, and/or pattern of the display over the target portion whenever a camera or a proximity sensor system (e.g., that includes the light sensor) determines that a gesture (e.g., hand gesture or facial expression gesture) is being observed over the target portion of the display. For example, the mobile device can turn the target portion substantially transparent or at least translucent for the duration of the gesture.

In this disclosure, opaqueness and transparency of the opaqueness adjustable region correspond to detectability of external light outside of the mobile device by the light sensor. Accordingly, opaqueness can be achieved by substantial blockage of the external light or by the display emitting sufficient light to oversaturate the light sensor and thus making the external light undetectable. In some embodiments, the display is an OLED display that is substantially transparent in a passive state. To adjust the opaqueness, the mobile device can turn off light emitting pixels of the OLED at the target portion to make the target portion substantially transparent. The target portion of the OLED display can be turned off whenever the light sensor is active. In some embodiments, the display is a liquid crystal display (LCD). In these embodiments, the mobile device can cause one or more liquid crystals of the LCD at the target portion to optically rotate light passing through the LCD toward the light sensor. In some embodiments, the display includes a nonadjustable region incapable of opaqueness adjustment.

At step 508, the mobile device can capture the image utilizing at least the light sensor while the target portion of the opaqueness adjustable region is substantially transparent. The mobile device can capture the image while the mobile device is displaying a video on the display. The mobile device can capture the image between two consecutive frames of the video played on the display (e.g., when the target portion of the opaqueness adjustable region of the display is substantially transparent). For example this can be achieved by turning the target portion of the display substantially transparent for a sufficiently short duration. The target portion can be kept substantially transparent for a duration sufficiently short to be substantially undetectable by human eyes (e.g., average human eyes or any human eyes).

In some embodiments, the mobile device can flash a light source immediately before or during said capturing of the image. The light source can be part of the display.

In various embodiments, the mobile device can utilize the captured image for various applications. In some examples, at step 510, the mobile device can analyze the image to identify a gesture to trigger a command in the operating system of the mobile device. In some examples, at step 512, the mobile device can utilize the captured image to recognize a biometric pattern to provide access to at least a subset of the user interface based on the recognized biometric pattern. In some examples, at step 514, the mobile device can utilize the captured image to videoconference with an external device. The light sensor (e.g., as part of a camera) can be positioned in the middle of the display to enable a user of the mobile device to maintain eye contact with an external user of the external device while videoconferencing. In some examples, at step 516, the mobile device can identify a real world object from the captured image to render, in substantially real-time relative to said capturing the image, a video representation of the real world object on the display of the mobile device (e.g., for augmented reality or reverse augmented reality). For example, the real world object can be rendered with virtual objects and/or in a virtual world.

In some embodiments, the mobile device can include multiple cameras to determine depth information (e.g., for gesture detection, three-dimensional (3D) imaging, or 3D biometric detection). The light sensor can be a first light sensor of a first camera. The mobile device can include a second light sensor in a second camera. The mobile device can capture a second image utilizing the second camera. The mobile device can utilize the first image and the second image to determine a distance between an object, in front of the mobile device and within a field of view of the first camera and the second camera, and the display.

Figure 6:
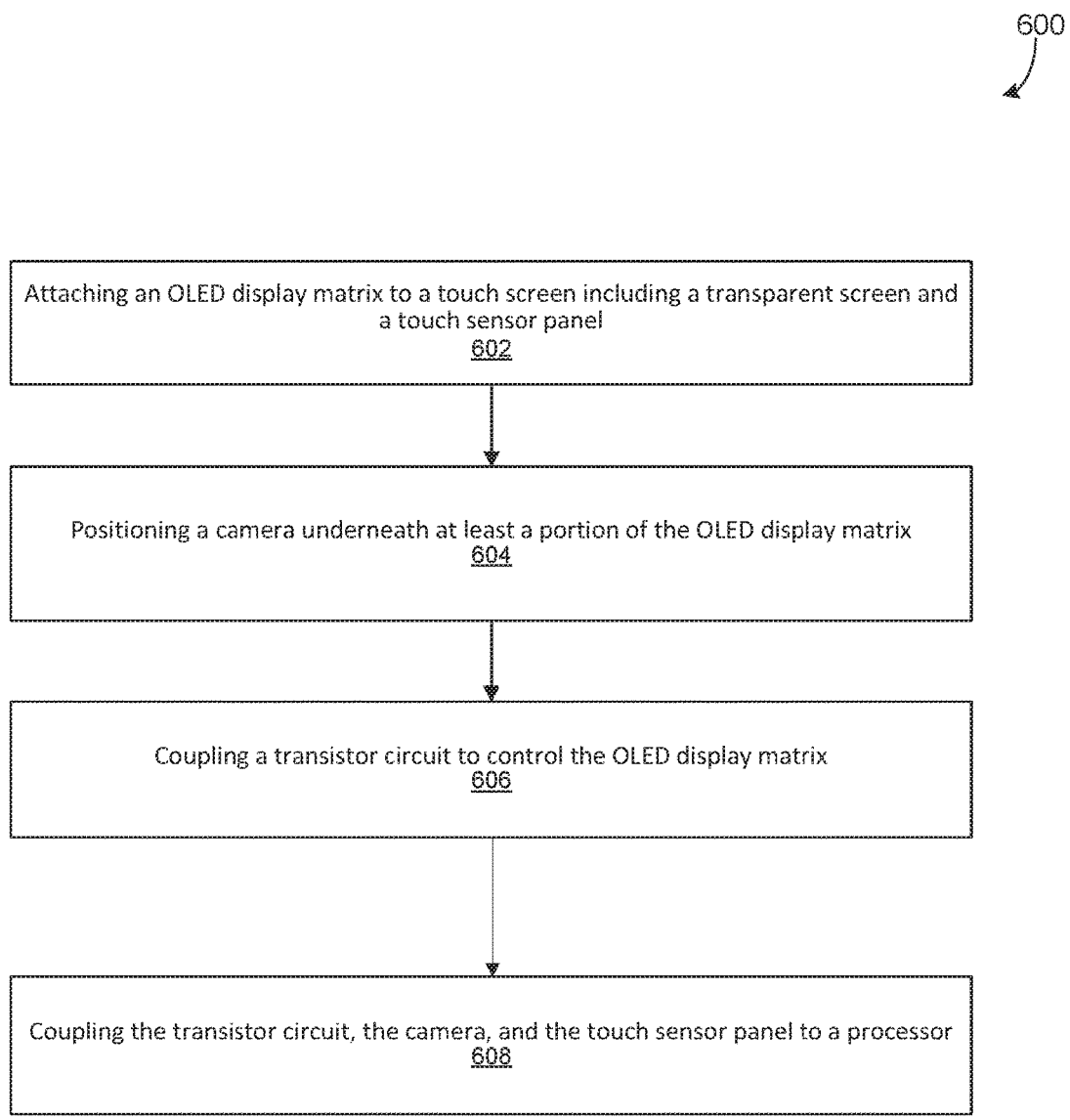
FIG. 6 is a flow chart of a method of manufacturing a display assembly for a mobile device, in accordance with various embodiments.

FIG. 6 is a flow chart of a method 600 of manufacturing a display assembly for a mobile device, in accordance with various embodiments. At step 602, an OLED display matrix can be attached to a touch screen. The touch screen can include a transparent screen and a touch sensor panel. Step 604, a camera can be positioned underneath at least a portion of the OLED display matrix. For example, the camera can be positioned entirely under the OLED display matrix. In another example, the camera can be positioned above or in plane with a bottom electrode layer of the OLED display matrix.

At step 606, a transistor circuit (e.g., a TFT layer) can be coupled to the OLED display matrix. The transition circuit can be used to control individual pixels in the OLED display matrix. For example, the transition circuit can control the brightness, the color, on and off states, or any combination thereof. At step 608, the transistor circuit, the camera, and the touch sensor panel can be coupled to a processor of the mobile device.

While processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. In addition, while processes or blocks are at times shown as being performed in series, these processes or blocks may instead be performed in parallel, or may be performed at different times. When a process or step is "based on" a value or a computation, the process or step should be interpreted as based at least on that value or that computation.

Some embodiments of the disclosure have other aspects, elements, features, and steps in addition to or in place of what is described above. These potential additions and replacements are described throughout the rest of the specification. Reference in this specification to "various embodiments" or "some embodiments" means that a particular feature, structure, or characteristic described in connection with the embodiment is included in at least one embodiment of the disclosure. Alternative embodiments (e.g., referenced as "other embodiments") are not mutually exclusive of other embodiments. Moreover, various features are described which may be exhibited by some embodiments and not by others. Similarly, various requirements are described which may be requirements for some embodiments but not other embodiments. Reference in this specification to where a result of an action is "based on" another element or feature means that the result produced by the action can change depending at least on the nature of the other element or feature.

What is claimed is:

1. A mobile device comprising:
   a transparent screen substrate;
   an organic light emitting diode (OLED) display matrix underneath the transparent screen substrate, wherein the OLED display matrix includes two electrode layers sandwiching one or more organic layers, and wherein a first electrode layer of the electrode layers is composed of a transparent material and a second electrode layer of the electrode layers is composed of a non-transparent material;
   a camera underneath the transparent screen substrate and disposed above or in plane with a metallic electrode layer, wherein a light sensor of the camera is pointed toward the transparent screen substrate, wherein the camera is disposed above the second electrode layer and below the organic layers; and
   a processor to send a command to the OLED display matrix to turn a region thereon substantially transparent while the mobile device is displaying a visual representation on the OLED display matrix and the processor to send a command to the camera to capture an image.

2. A mobile device comprising:
   a transparent screen substrate;
   an organic light emitting diode (OLED) display matrix underneath the transparent screen substrate, wherein the OLED display matrix includes two electrode layers sandwiching one or more organic layers, and wherein a first electrode layer of the electrode layers is composed of a transparent material and a second electrode layer of the electrode layers is composed of a non-transparent material;
   a camera underneath the transparent screen substrate and disposed above or in plane with a metallic electrode layer, wherein a light sensor of the camera is pointed toward the transparent screen substrate, wherein the camera is disposed above or in plane with the second electrode layer and below the organic layers; and
   a processor to send a command to the OLED display matrix to turn a region thereon substantially transparent while the mobile device is displaying a visual representation on the OLED display matrix and the processor to send a command to the camera to capture an image.

3. A display assembly for a mobile device, the display assembly comprising:
   a transparent screen substrate;
   an organic light emitting diode (OLED) display matrix underneath the transparent screen substrate;
   a light sensor circuit underneath the transparent screen substrate, at least partially underneath the OLED display matrix and disposed above or in plane with a metallic electrode layer, wherein a light sensor of the light sensor circuit is pointed toward the transparent screen substrate;
   wherein the OLED display matrix includes one or more substantially transparent layers (metallic or organic) above the light sensor; and
   a processor to send a command to the OLED display matrix to turn a region thereon substantially transparent while the mobile device is displaying a visual representation on the OLED display matrix and the processor to send a command to the light sensor to capture an image.

4. The display assembly of claim 3, wherein the substantially transparent layers include at least an organic layer and an electrically conductive layer.

5. The display assembly of claim 3, wherein the light sensor circuit includes a camera and the light sensor is part of the camera.

6. The display assembly of claim 3, further comprising an optics layer between at least a part of the OLED display matrix and the light sensor circuit.

7. The display assembly of claim 3, wherein the light sensor circuit is a proximity sensor.

8. The display assembly of claim 3, wherein the light sensor circuit includes at least two cameras spaced apart from each other.

9. A method of manufacturing a display assembly for a mobile device, the method comprising:
attaching an organic light emitting diode (OLED) display matrix to a touch screen including a transparent screen and a touch sensor panel;
positioning a camera underneath at least a portion of the OLED display matrix above or in plane with a metallic electrode layer;
coupling a transistor circuit to control the OLED display matrix;
coupling the transistor circuit, the camera, and the touch sensor panel to a processor; and
configuring the processor to send a command to the OLED display matrix to turn a region thereon substantially transparent while the mobile device is displaying a visual representation on the OLED display matrix and to send a command to the camera to capture an image.

10. The method of claim 9, wherein positioning the camera includes positioning the camera above or in plane with a bottom electrode layer of the OLED display matrix.

11. A method to provide a mobile device comprising:
providing a transparent screen substrate;
providing an organic light emitting diode (OLED) display matrix underneath the transparent screen substrate, wherein the OLED display matrix includes two electrode layers sandwiching one or more organic layers, and wherein a first electrode layer of the electrode layers is composed of a transparent material and a second electrode layer of the electrode layers is composed of a non-transparent material;
providing a camera underneath the transparent screen substrate and disposed above or in plane with a metallic electrode layer, wherein a light sensor of the camera is pointed toward the transparent screen substrate, wherein the camera is disposed above the second electrode layer and below the organic layers; and
providing a processor to send a command to the OLED display matrix to turn a region thereon substantially transparent while the mobile device is displaying a visual representation on the OLED display matrix and the processor to send a command to the camera to capture an image.

12. A method to provide a mobile device comprising:
providing a transparent screen substrate;
providing an organic light emitting diode (OLED) display matrix underneath the transparent screen substrate, wherein the OLED display matrix includes two electrode layers sandwiching one or more organic layers, and wherein a first electrode layer of the electrode layers is composed of a transparent material and a second electrode layer of the electrode layers is composed of a non-transparent material;
providing a camera underneath the transparent screen substrate and disposed above or in plane with a metallic electrode layer, wherein a light sensor of the camera is pointed toward the transparent screen substrate, wherein the camera is disposed above or in plane with the second electrode layer and below the organic layers; and
providing a processor to send a command to the OLED display matrix to turn a region thereon substantially transparent while the mobile device is displaying a visual representation on the OLED display matrix and the processor to send a command to the camera to capture an image.

13. A method to provide display assembly for a mobile device, the display assembly comprising:
providing a transparent screen substrate;
providing an organic light emitting diode (OLED) display matrix underneath the transparent screen substrate;
providing a light sensor circuit underneath the transparent screen substrate, at least partially underneath the OLED display matrix and disposed above or in plane with a metallic electrode layer, wherein a light sensor of the light sensor circuit is pointed toward the transparent screen substrate;
wherein the OLED display matrix includes one or more substantially transparent layers (metallic or organic) above the light sensor; and
providing a processor to send a command to the OLED display matrix to turn a region thereon substantially transparent while the mobile device is displaying a visual representation on the OLED display matrix and the processor to send a command to the light sensor to capture an image.

14. The method of claim 13, wherein the substantially transparent layers include at least an organic layer and an electrically conductive layer.

15. The method of claim 13, wherein the light sensor circuit includes a camera and the light sensor is part of the camera.

16. The method of claim 13, further comprising providing an optics layer between at least a part of the OLED display matrix and the light sensor circuit.

17. The method of claim 13, wherein the light sensor circuit is a proximity sensor.

18. The method of claim 13, wherein the light sensor circuit includes at least two cameras spaced apart from each other.

* * * * *